United States Patent
Hopper et al.

(10) Patent No.: US 8,390,093 B1
(45) Date of Patent: Mar. 5, 2013

(54) SYSTEM AND METHOD OF GALVANIC ISOLATION IN DIGITAL SIGNAL TRANSFER INTEGRATED CIRCUITS UTILIZING CONDUCTIVITY MODULATION OF SEMICONDUCTOR SUBSTRATE

(75) Inventors: Peter J. Hopper, San Jose, CA (US);
Peter Smeys, San Jose, CA (US);
William French, San Jose, CA (US);
Andrei Papou, San Jose, CA (US);
Aditi Dutt Chaudhuri, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/230,171

(22) Filed: Sep. 12, 2011

(51) Int. Cl.
*H01L 21/70* (2006.01)
*H01L 21/00* (2006.01)
*H04B 1/44* (2006.01)

(52) U.S. Cl. ............... 257/506; 438/3; 438/59; 455/78
(58) Field of Classification Search .............. 257/506, 257/531; 438/381, 400, 59, 3; 326/82, 83; 455/78

See application file for complete search history.

(56) References Cited

U.S. PATENT DOCUMENTS

| | | | |
|---|---|---|---|
| 5,028,101 A * | 7/1991 | Sugai et al. | 333/193 |
| 2002/0151090 A1* | 10/2002 | Wong | 438/3 |
| 2003/0042571 A1* | 3/2003 | Chen et al. | 257/531 |
| 2004/0207431 A1* | 10/2004 | Haigh et al. | 326/83 |
| 2005/0207183 A1* | 9/2005 | Chang | 363/17 |
| 2008/0311862 A1* | 12/2008 | Spina et al. | 455/78 |
| 2010/0329364 A1* | 12/2010 | Giombanco et al. | 375/258 |

OTHER PUBLICATIONS

Kazimierczuk, "High Frequency Magnatic Components",John Wiley & Sons, pp. 337, 2009.*
Arpad A. Barna and Dale Horelick, "A Simple Diode Model Including Conductivity Modulation", IEEE Transactions on Circuit Theory, vol. CT-18, No. 2, Mar. 1971.*

* cited by examiner

*Primary Examiner* — Long Tran
*Assistant Examiner* — Dzung Tran
(74) *Attorney, Agent, or Firm* — Eugene C. Conser; Wade J. Brady, III; Frederick J. Telecky, Jr.

(57) ABSTRACT

A galvanic isolation system provides galvanic isolation in digital transfer integrated circuits by using conductivity modulation of the semiconductor substrate. Modulation of the conductivity of the substrate affects eddy current losses of a (differential) RF inductor that is isolated from the substrate by a sufficient amount of dielectric material, which provides a basis for signal transfer from the modulated substrate to the inductor across the isolation barrier.

6 Claims, 3 Drawing Sheets

SYSTEM AND METHOD OF GALVANIC ISOLATION IN DIGITAL SIGNAL TRANSFER INTEGRATED CIRCUITS UTILIZING CONDUCTIVITY MODULATION OF SEMICONDUCTOR SUBSTRATE

FIELD OF THE INVENTION

The present invention relates to galvanic isolation of integrated circuits and, in particular, to a system and method of galvanic isolation that utilizes modulation of the conductivity of a semiconductor substrate, which affects eddy current loss generated in the substrate by an isolated RF inductor.

BACKGROUND OF THE INVENTION

Known methods of galvanic isolation used in on-chip or in-package digital signal processing (DSP) systems include optoelectronic-couplers, inductive coupling transformers, capacitive couplers, inductive coupling bond wire transformers, and inductive coupling magnetoresistor-based coupling devices.

FIG. 1 shows a galvanic isolation system 100 that utilizes an optoelectronic coupler. The system 100 comprises proven technology that is widely used and provides low cost per basic unit. The system 100 provides high isolation capability and requires no data encoding. However, it requires high power (10 mA). If fast light emitting diodes (LEDs) are used, they are expensive and their response time degrades over time. The system 100 also exhibits low speed performance (~50 Mbps), high temperature dependence and utilizes a large board footprint.

FIG. 2 shows a galvanic isolation system 200 that utilizes an inductive coupling transformer. The system 200 is low cost, exhibits high performance and can be implemented in CMOS technology. It also exhibits high common mode rejection, utilizes very low power, depends little on temperature and utilizes a small board footprint. However, it is sensitive to external magnetic fields and requires clock encoded data.

FIG. 3 shows a galvanic isolation system 300 that utilizes capacitive coupling. The system 300 is low cost and can be implemented using CMOS technology. It exhibits little temperature dependency and is relatively immune to magnetic interference. However, it also exhibits low common mode transient immunity, higher noise, larger area than the other conventional options, and requires clock encoded data.

FIG. 4 shows a galvanic isolation system 400 that utilizes an inductive coupling bond wire transformer. The system 400 exhibits poor flux coupling, low speed and poor manufacturability.

FIG. 5 shows a galvanic isolation system 500 that utilizes an inductive coupling magnetoresistor. The system 500 exhibits benefits similar to and the same data rates as the transformer systems. However, it requires giant magnetoresistor (GMR) technology and is sensitive to external magnetic fields.

SUMMARY OF THE INVENTION

In a disclosed embodiment, galvanic isolation in digital transfer integrated circuits is provided by using conductivity modulation of the semiconductor substrate. Modulation of the conductivity of the substrate affects the eddy current losses of a (differential) RF inductor that is isolated from the substrate by a sufficient amount of dielectric material, which provides a basis for signal transfer from the modulated substrate to the inductor across the isolation barrier.

The features and advantages of the various aspects of the subject matter disclosed herein will be more fully understood and appreciated upon consideration of the following detailed description and accompanying drawings, which set forth illustrative embodiments in which the concepts of the claimed subject matter are utilized.

BRIEF DESCRIPTION OF THE DRAWINGS

In the drawings, like reference numerals are sometimes used to designate like structural elements. It should also be appreciated that the depictions in the figures are diagrammatic and not to scale.

DETAILED DESCRIPTION OF THE INVENTION

Figure 1:
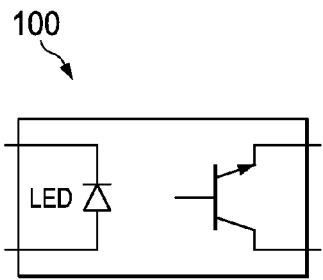
FIG. 1 is a schematic diagram illustrating a prior art galvanic isolation system that utilizes an optoelectronic coupler.
Figure 2:
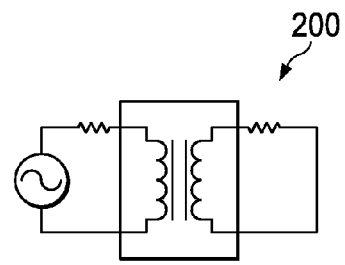
FIG. 2 is a schematic diagram illustrating a prior art galvanic isolation system that utilizes an inductive coupling transformer.
Figure 3:
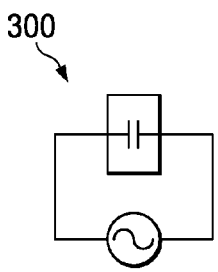
FIG. 3 is a schematic diagram illustrating a prior art galvanic isolation system that utilizes capacitive coupling.
Figure 4:
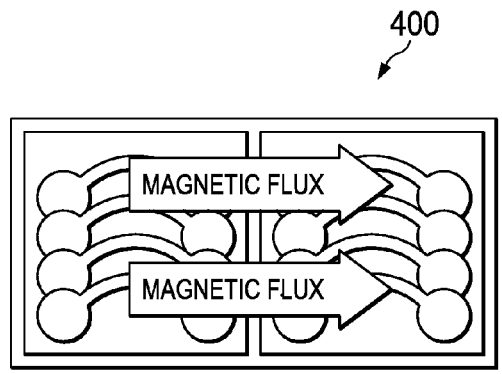
FIG. 4 is a schematic diagram illustrating a prior art galvanic isolation system that utilizes an inductive coupling bond wire transformer.
Figure 5:
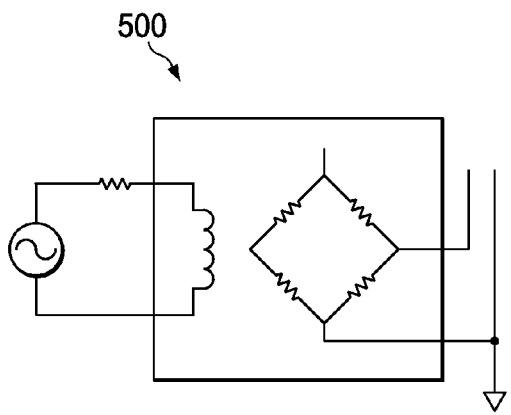
FIG. 5 is a schematic diagram illustrating a prior art galvanic isolation system that utilizes an inductive coupling magnetoresistor.
Figure 6:
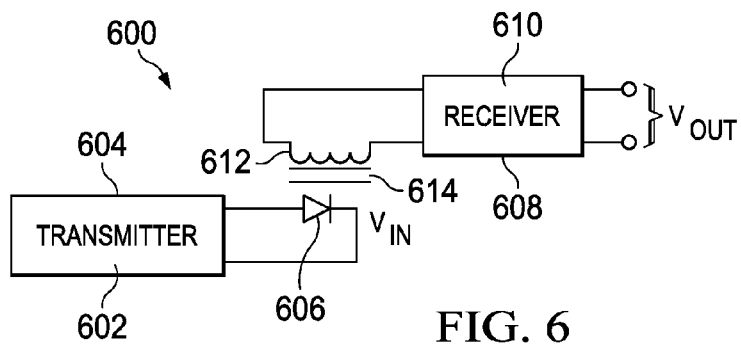
FIG. 6 is a schematic diagram illustrating a galvanic isolation system that utilizes modulation of the conductivity of a semiconductor substrate.

FIG. 6 shows a galvanic isolation system 600 that provides galvanic isolation in a digital transfer integrated circuit by using conductivity modulation of the semiconductor substrate. As discussed in greater detail below, modulation of the conductivity of the semiconductor (e.g., crystalline silicon) substrate affects the eddy current losses of a (differential) RF inductor that is isolated from the substrate by a sufficient amount of dielectric material, which provides a basis for signal transfer from the modulated substrate to the inductor across the isolation barrier.

As shown in FIG. 6, the galvanic isolation system 600 includes a transmitter circuit 602 that is implemented in a semiconductor substrate 604. A digital signal generated by the transmitter circuit 602 modulates conductivity by using, for example, a reverse biased diode 606 formed as part of the transmitter circuit 602. A receiver circuit 608 is implemented in a different die 610, which is integrated during wafer level fabrication. An RF inductor 612, while being formed as part of the receiver circuit 610, is fabricated directly above the diode 606 of the transmitter circuit 602. A dielectric barrier 614 provides galvanic isolation between the diode 606 of the transmitter circuit 602 and the inductor 612 of the receiver circuit 608. The receiver circuit 608 senses impedance change of the inductor 612 due to changed eddy current loss in the depletion region of the diode structure. Thus, the digital signal appears on the receiver circuit side of the isolation barrier 614.

The choice of substrate doping concentration plays a key role. If the substrate doping concentration is too low, then the substrate is resistive with no significant eddy current loss created by the external RF inductor 612. The modulated state does not produce a lossy enough depletion layer to incur a significant increase in impedance of the RF inductor 612. If, in contrast, the substrate doping concentration is too high, then the: substrate is lossy in an unmodulated state. The thickness of the depletion layer is not increased by much in a modulated to notice inductor quality factor degradation. Those skilled in the art will appreciate that the proper substrate dopant concentration will depend upon the particular application of the system 600.

Figure 7:
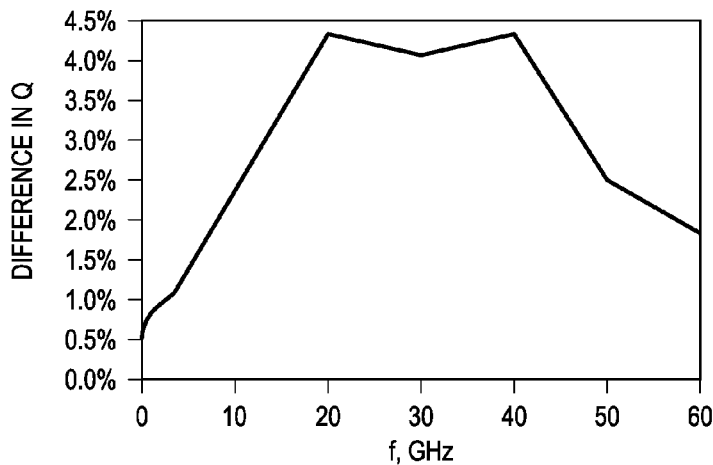
FIG. 7 is a graph showing simulation results utilizing a galvanic isolation system of the type shown in FIG. 6.

As shown in FIG. 7, simulations suggest that over 4% changes in impedance are achievable with systems of the type shown in FIG. 6 at frequencies of about 20 GHz.

Figure 8A:
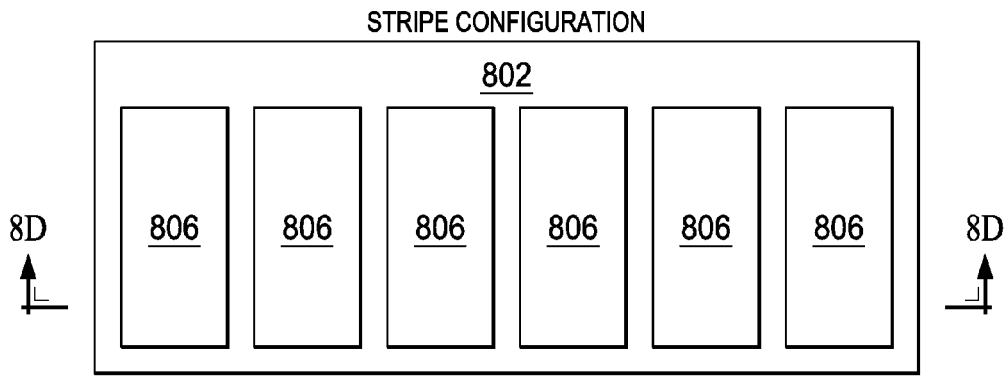
FIG. 8A shows a topographical layout of a diode array configured in a stripe pattern.
Figure 8B:
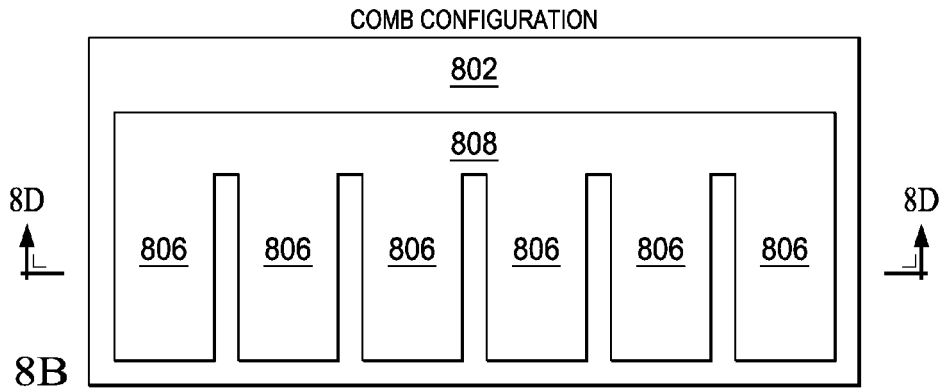
FIG. 8B shows a topographical layout of a diode array configured in a comb pattern.
Figure 8C:
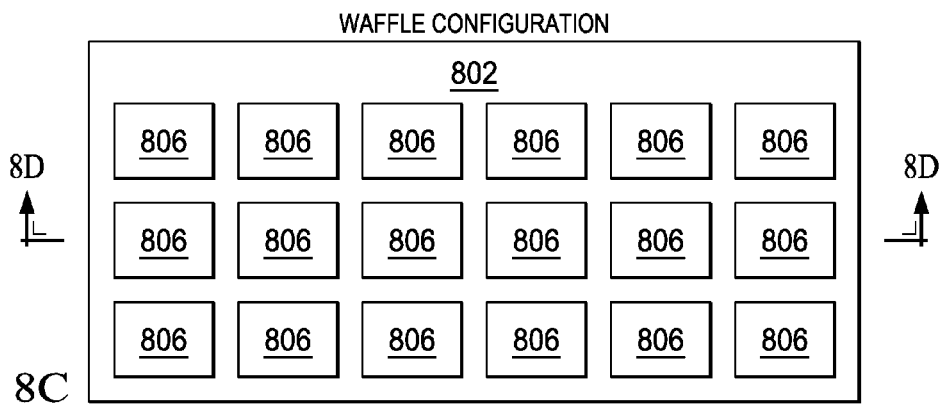
FIG. 8C shows a topographical layout of a diode array configured in a waffle pattern.
Figure 8D:
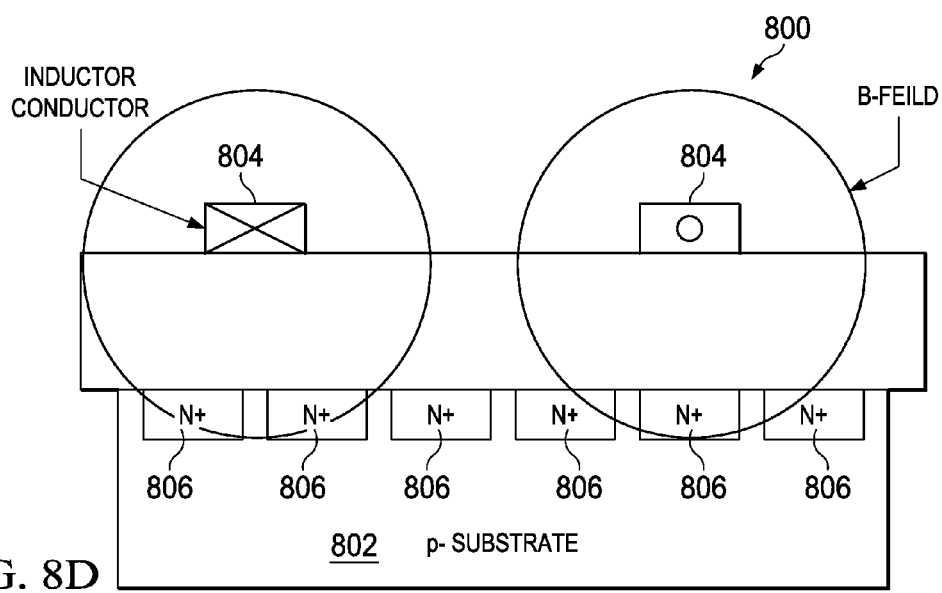
FIG. 8D shows a cross section of the embodiment of a galvanic isolation system that utilizes modulation of the conductivity of a semiconductor substrate through the sections 8D of each of the diode array configurations of FIGS. 8A through 8C.

FIG. 8D shows an embodiment of a structure of a galvanic isolation system 800 that utilizes modulation of the conductivity of a semiconductor substrate 802. An inductor 804 is fabricated in the interconnect metal of a second semiconductor substrate to overly an array of diodes 806 formed in the substrate 802. The diodes 806 may be arrayed, for example, either as stripes, FIG. 8A, in a comb pattern, FIG. 8B, or as shown in FIG. 8C as a waffle pattern. The diodes 806 are electrically connected together and are all reverse biased under a common signal. The depletion layers in the substrate 802 are thus modulated, leading to overall modulated sheet resistance. The substrate in which the inductor structure 804 is formed is separated from the substrate 802 by intervening high voltage dielectric insulator material 808 (e.g., silicon oxide). Thus, by changing the common potential on the diode array, the depletion layers associated with the diodes 806 are modulated. The overall depletion layer in turn modulates the bulk resistivity of the surface layer. Hence, the overlying inductor 804 "sees" a sheet with a modulated conductivity. In turn, the inductance of the inductor 804 is consequently modulated as a function of the diode4 bias as the lossy mutual inductance coupling to the depletion layer changes the inductance. This change in inductance is the result of eddy currents being induced to varying (modulated) degrees in the depleted layer and detracting from the B-field storing energy in the inductor 804.

It should be understood that the particular embodiment described herein has been provided by way of example and that other modifications may occur to those skilled in the art without departing from the scope of the claimed subject matter as expressed in the append claims and their equivalents.

What is claimed is:

1. A system for communicating across a galvanic isolation system comprising:
   a transmitter circuit that includes an array of reverse biased diodes each of the reverse biased diodes forming a depletion layer in a first semiconductor substrate;
   the array of reversed biased diodes is one of the following:
   a stripe pattern;
   a waffle pattern;
   the reversed biased diodes of the array are electrically connected together and all are reverse biased under a common signal, wherein the depletion layers in the first substrate are thus modulated leading to an overall modulated sheet resistance;
   such that the array of reverse biased diodes modulates the conductivity of the first semiconductor substrate such that the modulated conductivity of the first semiconductor substrate causes changes in inductance of the RF inductor;
   a receiver circuit that includes an RF inductor that is formed over the reverse biased diode array; and impedance detection circuitry for detecting changes in inductive impedance corresponding to modulated signals;
   a dielectric isolation barrier formed between the array of reverse biased diodes and the RF inductor;
   wherein the transmitter circuit is formed on the first semiconductor substrate and the receiver circuit is formed on a second semiconductor substrate;
   thereby providing signal transfer from the modulated first semiconductor substrate to the RF inductor across the dielectric isolation barrier corresponding to the modulated conductivity.

2. The system for communicating across a galvanic isolation system of claim 1, wherein the first semiconductor substrate and the second semiconductor substrate both comprise silicon.

3. A method of forming a system for communicating across a galvanic isolation system comprising:
   providing a transmitter circuit that includes an array of reverse biased diodes each of the reverse biased diodes forming a depletion layer in a first semiconductor substrate;
   configuring the array of reversed biased diodes in one of the following arrays:
   a stripe pattern;
   a waffle pattern;
   electrically connecting the array of reversed biased diodes together such that all diodes are reversed biased under a common signal, wherein the depletion layers in the first substrate are thus modulated leading to an overall modulated sheet resistance;
   such that the array of reverse biased diodes modulates the conductivity of the first semiconductor substrate such that the modulated conductivity of the first semiconductor substrate causes changes in inductance of the RF inductor;
   providing a receiver circuit that includes an RF inductor that is formed over array of the reverse biased diodes; and impedance detection circuitry for detecting changes in inductive impedance corresponding to modulated signals;
   forming a dielectric isolation barrier between the array of reverse biased diodes and the RF inductor;
   wherein the transmitter circuit is formed on a first semiconductor substrate and the receiver circuit is formed on a second semiconductor substrate;
   thereby providing signal transfer from the modulated first semiconductor substrate to the RF inductor across the dielectric isolation barrier corresponding to the modulated conductivity.

4. The method of claim 3, wherein the first semiconductor substrate and the second semiconductor substrate both comprise silicon.

5. A method of galvanic isolation between a system for communicating across a transmitter circuit and a receiver circuit, the method comprising;
   forming the transmitter circuit on a first semiconductor substrate, the transmitter circuit including an array of reverse biased diodes;
   forming the receiver circuit on a second semiconductor substrate, the receiver circuit including an RF inductor that is formed directly above the array of reverse biased diodes, impedance detection circuitry for detecting changes in inductive impedance corresponding to modulated signals, the array of reverse biased diodes and the RF inductor having an dielectric barrier formed therebetween;

thereby providing signal transfer from the modulated first semiconductor substrate to the RF inductor across the dielectric isolation barrier corresponding to the modulated conductivity.

6. The method of claim 5 wherein the first semiconductor substrate and the second semiconductor substrate both comprise silicon.

* * * * *